United States Patent
Ramsay (10) Patent No.: US 6,342,103 B1
(45) Date of Patent: Jan. 29, 2002

(54) MULTIPLE POCKET ELECTRON BEAM SOURCE

(75) Inventor: Bruce G. Ramsay, Novato, CA (US)

(73) Assignee: The BOC Group, Inc., Murray Hill, NJ (US)

( * ) Notice: Subject to any disclaimer, the term of this patent is extended or adjusted under 35 U.S.C. 154(b) by 0 days.

(21) Appl. No.: 09/584,940

(22) Filed: Jun. 1, 2000

(51) Int. Cl.$^7$ .................. C23C 16/00; C23C 14/00; B05D 3/00
(52) U.S. Cl. .............. 118/726; 118/723 EB; 118/727; 427/596; 427/566
(58) Field of Search .......... 118/726, 723 EB, 118/727, 723 CB, 723 VE, 721, 720, 724; 427/566, 596, 592, 597; 315/111.81

(56) References Cited

U.S. PATENT DOCUMENTS

| | | | |
|---|---|---|---|
| 2,482,329 A | | 9/1949 | Dimmick |
| 2,853,402 A | * | 9/1958 | Blois, Jr. .................... 427/599 |
| 4,108,107 A | | 8/1978 | Scheuermann |
| 4,328,763 A | * | 5/1982 | Sommerkamp et al. ..... 118/727 |
| 4,632,059 A | | 12/1986 | Flatscher et al. |
| 4,748,935 A | | 6/1988 | Wegmann |
| 4,944,245 A | | 7/1990 | Stoessel et al. |
| 5,190,590 A | | 3/1993 | Suzuki et al. |
| 5,473,627 A | | 12/1995 | Tsujimoto et al. |
| 5,792,521 A | | 8/1998 | Wortman |
| 6,012,413 A | * | 1/2000 | Tsujimoto et al. .... 118/723 EB |

* cited by examiner

Primary Examiner—Gregory Mills
Assistant Examiner—P. Hassanzodeh
(74) Attorney, Agent, or Firm—Skjerven Morrill MacPherson, LLP.; Peter G. Mikhail (57) ABSTRACT

An improved crucible cover for multiple pocket electron beam sources has been invented. The invention provides selection between one of the multiple pockets for evaporative heating and a noncontacting, line-of-sight blocking baffle between heated and unheated pockets. In one embodiment, the baffle is formed by the cooperation of a crucible surface groove with a cover feature that extends into the groove. In a second embodiment, the baffle is formed by a barrier extending upwards from the crucible surface between pockets that cooperates with a cover to form the line-of-sight baffle. The crucible and cover in these embodiments accommodate deposits without hindering the ability of the baffle to reduce contamination or interfere with the operation of the source. Additionally, the cover and crucible may be operated separately, with a cover lifting mechanism that lowers the cover to form a baffle and raises the cover to allow the separately controlled rotation of the crucible. By blocking the line-of-sight between pockets and providing a way to reduce contamination from deposits, the present invention eliminates the main sources of material contamination in multiple pocket sources.

21 Claims, 8 Drawing Sheets

MULTIPLE POCKET ELECTRON BEAM SOURCE

FIELD OF THE INVENTION

This invention generally relates to crucible covers for multiple pocket electron beam sources used in vacuum coating systems in which individual crucible pockets containing coating materials are heated to produce coating vapors. The invention further relates to cooperating cover and crucible combinations that isolate heated pockets from all other pockets by forming a line-of-sight blocking baffle.

BACKGROUND OF THE INVENTION

Vacuum coating or deposition of materials is a process commonly used in the manufacture of a variety of products including, but not limited to, semiconductors, optics, and the formation of thermal barriers on high temperature components. One method for coating materials having very small vapor pressures, such as metals or ceramics, is by placing the coating material and a workpiece to be coated in a vacuum chamber, reducing the pressure (typically in the range of $10^{-7}$ to $10^{-4}$ Torr), and heating the material. The resulting coating vapor streams outwards from the material and coats the surface of the workpiece. Due to the low vacuum chamber pressure, vaporized coating materials travel nearly unimpeded, following an approximately line-of-sight trajectory. The most common sample heating method uses directed electron beam energy.

Many manufacturing steps involve depositing multilayered coatings of a multitude of materials. Generally it is important to be able to control the coating purity and deposition thickness to achieve desired results. In addition, many of the benefits of producing multiple coating layers on a workpiece are achieved when the coating steps are carried out sequentially under vacuum, and the trend in coating technology has been towards obtaining purer, more uniform and controllable coating thickness of multiple materials. An apparatus for carrying out sequential coating is disclosed in U.S. Pat. No. 2,482,329, which describes a mechanism for sequentially moving crucible pockets in line with a single heating source in a single vacuum chamber. While the mechanism of that patent was used in conjunction with electric resistance heating, the same mechanism works just as well with other sources, such as electron beams (see, for example, U.S. Pat. No. 4,632,059 to Flatscher et al.). The use of electron beams, which can be positioned using controllable magnetic fields, allows for the option of keeping the samples in place while deflecting the heating source, as disclosed in U.S. Pat. No. 5,792,521.

One major problem with the open material containers disclosed in the previously referenced patents is cross-contamination between crucibles. Although the majority of coating materials is directed away from its source, some material invariably diffuses back towards the source, contaminating the other source materials. This reduces the purity of the coating material and limits the usefulness of multiple coating chambers. One solution to this contamination problem is to incorporate a noncontacting crucible cover or movable lid with an opening that allows vapor from the heated sample to coat the workpiece, while shielding all of the other samples contamination. A typical cover arrangement is shown in U.S. Pat. No. 4,748,935 to Wegmann, which discloses an electron beam heated vapor source with such a cover. The arrangement is that of a flat, fixed cover and a multiple pocket crucible that rotates the samples through a heating region, allowing each pocket in turn to become a heated pocket. The cover and crucible are separated by a small gap that limits, but does not eliminate, line-of-sight contamination. In this configuration coating deposits that build up on the lid, interfering with the desired operation of the cover and requiring much maintenance. In addition, this type of cover can result in a new path for contamination—cover deposits can be scraped off or flake off into crucibles containing different materials. Nearly all covers known in the art rely on close tolerances to reduce, but not eliminate, line-of-sight contamination, and thus they still have the disadvantage of providing a path for contamination.

Some of the limitations of noncontacting covers were addressed in U.S. Pat. No. 4,944,245 to Stoessl et al. In Stoessl et al., a cover contacts the crucible surface in the vicinity of the heated sample to hinder the flow of material from the heated sample to any unheated samples. The cover and crucible are connected so that crucible rotation lifts the cover, allowing for sample selection. Although this approach reduces contamination by vapors migrating from heated to unheated samples, it is well known by those in the art that coating material rapidly accumulates on cover and crucible surfaces located within line-of-sight and particularly on those surfaces that are also near heated samples. In addition, the lifting mechanism described by Stoessl et al. occupies a large fraction of the crucible surface area, limiting the number of samples which can be accommodated. The coupled rotation and lifting mechanism of Stoessl et al. also allows for multiple contacts per material selection if the rotation is not between adjacent crucibles, which may increase the opportunity for cross-contamination.

In both the Wegmann and Stoessl et al. configurations, deposits have a tendency to rapidly accumulate thick layers of coating material that can easily flake or be scraped off and contaminate adjoining samples during rotation of the crucible. In addition, the close tolerances between cover and crucible in both of those references can be violated by deposits, requiring equipment maintenance limited by the ability of the cover mechanism to operate properly. It is desired to have an improved crucible cover that can accommodate deposits while reducing contamination.

SUMMARY

The prior art solution to reducing cross-contamination between pockets in multiple pocket sources relied on either closely spaced flat covers or covers that sealed with the crucible. Those solutions rely on maintaining close tolerances in regions where tolerances are difficult to maintain due to rapid build up of unwanted deposits. The present invention circumvents the problems in prior art systems by relying on a noncontacting baffle arrangement that is unaffected by unwanted deposits to a much greater degree. The present invention comprises a cover and crucible with matching features that, in combination, form a baffle to block the line-of-sight between heated and unheated crucible pockets, thereby reducing contamination. The rotation of the multiple crucible and lifting of the cover are controlled by separate mechanisms to provide flexibility in the design and operation of the source. Selection of any of the multiple pockets is achieved by rotating the crucible to the pocket of interest with the cover clear of the crucible. Cross-contamination protection is achieved by lowering the cover over the crucible to form a line-of-sight baffle after the selected crucible is properly aligned. In a first embodiment, the portion of the baffle nearest the heated pocket has a trough or grooves in the crucible with a cover lip that protrudes into the groove. This configuration allows the normal build up of coating materials on the cover top surface without causing degradation in performance from contamination or interference of moving parts. In a second embodiment there is a barrier that extends upwards from each of crucible pockets, while the cover protrudes below the barrier level, blocking line-of-sight between heated and unheated crucibles. In addition, the covers of the present invention lift away from the crucible prior to crucible rotation. In contrast to the prior art cam-based crucible lid combinations of Stoessl et al., in which the cover is lifted as the result of crucible rotation, the present invention reduces the amount of crucible surface area needed to implement the cover arrangement by providing a mechanism to lift the cover that does not depend on the rotation of the crucible.

The noncontact baffle arrangement of the present invention is an improvement over prior art covers are configured to either a) limit the line-of-sight between heated and unheated pockets with a close tolerance between cover and crucible, or b) forming a seal between cover and crucible. Both of those prior art covers have problems resulting from the build up of coating materials on the cover that tend to reduce their performance or that require frequent maintenance. In addition, some prior art covers place the edge of the cover near the top of the crucible pocket, thus allowing for the possibility of contamination due to deposits dropping directly into crucible pockets.

By providing a light tight, line-of-sight blocking baffle with clearance to allow for the build up of coating material, the present invention circumvents many of the problems with the prior art, allowing the cover to provide more contamination reduction for longer periods of time.

It is an advantage of the invention that a crucible cover for a multiple pocket evaporative source can be operated to greatly reduce cross-contamination of coating materials and that materials coating back onto the source not reduce the efficacy of the cover to reduce contamination or become a source for contamination.

It is yet another advantage of the invention that a multiple pocket crucible forms a line-of-sight blocking baffle in cooperation with a movable crucible cover, reducing cross-contamination between pockets without crucible-to-cover contact between heated and unheated crucible pockets.

It is an advantage of the invention that contamination is reduced with a crucible cover that can be lifted away from a crucible prior to rotation.

It is an advantage of the invention that it can be used for coating of materials that cold weld on contact by providing a contamination barrier that will not allow deposits to weld the crucible to the cover.

It is another advantage of the invention that materials that coat the cover do not hinder the movement of a turreted crucible.

It is a further advantage of the invention that the cover is lifted away from the crucible by an external lifting mechanism.

It is yet a further advantage of the invention that improved reliability and length of time between servicing will reduce the amount of scrap material and reduce the cost of operating coating equipment.

It is an advantage of the invention that it is simple and inexpensive to manufacture and service and that it is easy to use.

All patents cited herein are hereby incorporated by reference in their entirety for all purposes. Additional objects, advantages, aspects and features of the present invention will become apparent from the description of preferred embodiments, set forth below, which should be taken in conjunction with the accompanying drawings, a brief description of which follows, and in part will become apparent to those skilled in the art upon examination of the following or may be learned by practice of the invention.

BRIEF DESCRIPTION OF THE DRAWINGS

The above and other features and aspects of the present invention will become more apparent upon reading the following detailed description in conjunction with the accompanying drawings, in which.

Reference symbols are used in the Figures to indicate certain components, aspects or features shown therein, with reference symbols common to more than one Figure indicating like components, aspects or features shown therein. The reference symbols used herein are not to be confused with any reference symbols used in the items that have been incorporated herein by reference.

DESCRIPTION OF SPECIFIC EMBODIMENTS

Figure 1:
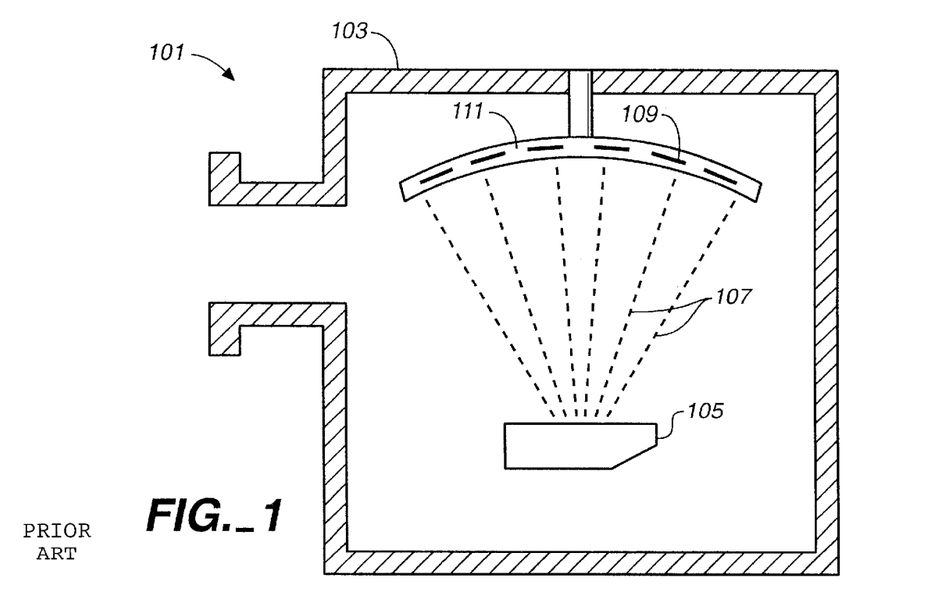
FIG. 1 is a schematic of a vacuum deposition system.

An example of a vacuum coating system 101 configured to coat workpieces such as semiconductor wafers is shown schematically in FIG. 1. Vacuum coating system 101 includes a vacuum chamber 103, an evaporative source 105 producing vapors of coating material 107, and a framework 111 generally positioned to uniformly coat a plurality of optical components, flat panel display panels, semiconductor wafers or other workpieces 109 that may be located approximately equidistant from source 105 or on a spherical surface of approximately constant coating rate. Vacuum chamber 103 is opened, and one or more substrates 109 are loaded onto framework 111. Using an electron beam evaporative source, materials with high boiling points or low vapor pressure, include many metals, semiconductors and refractory materials, can be coated or deposited onto workpieces. At the low pressures under which coating from evaporative and reactive evaporative processes occur, from about $10^{31\ 7}$ to about $10^{-4}$ Torr, the amount of background material in vacuum chamber 103 is very small, and material 107 travels nearly collision free, and in nearly a straight line, from source 105 to workpiece 109, coating surfaces within line-of-sight of the source.

The present invention is directed to an evaporative source that can hold many different materials for coating while reducing contamination between materials. As such it is applicable to a wide variety of coating systems, and this description is not meant to limit its use to the configuration of FIG. 1. Other applicable configurations include: fixing the framework to vacuum chamber, rotating the framework with a motor or executing more complex motion with a planetary gear system, moving the source within the chamber, and rotating the workpiece relative to the source.

Details of a first embodiment of the present are shown in FIGS. 2 to 6. Details of an evaporative source 105 are shown in the perspective views of FIGS. 2 and 3. A turreted crucible or turret 301 with six crucible pockets 201 is mounted inside of source housing 217. A variety of crucible materials and construction techniques are known to those skilled in the art. The present invention can be used in conjunction with any of these crucibles, including but not limited to: crucibles with high thermal conductivity, low melting point materials, such as copper or aluminum, that incorporate water cooling; crucibles constructed out of high melting point materials such as graphite, tungsten, or molybdenum; and crucibles with graphite liners or those that use surface oxidation to limit thermal conductivity from the evaporant to the crucible surface.

Figure 2:
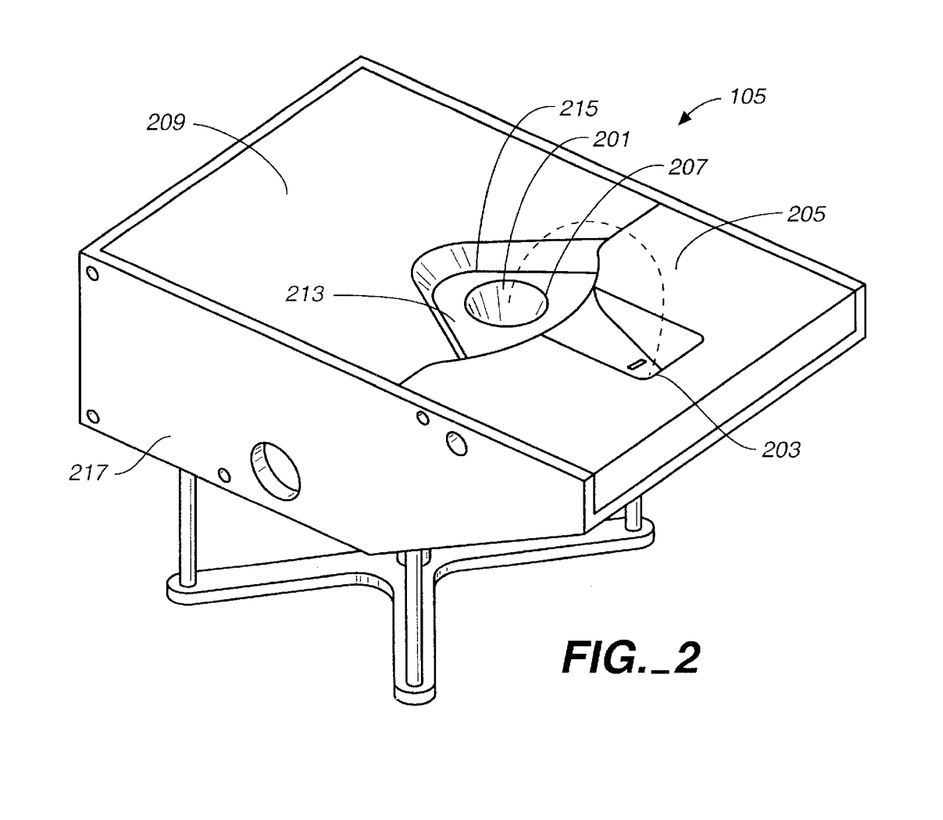
FIG. 2 is a perspective view of a first embodiment of the invention.
Figure 3:
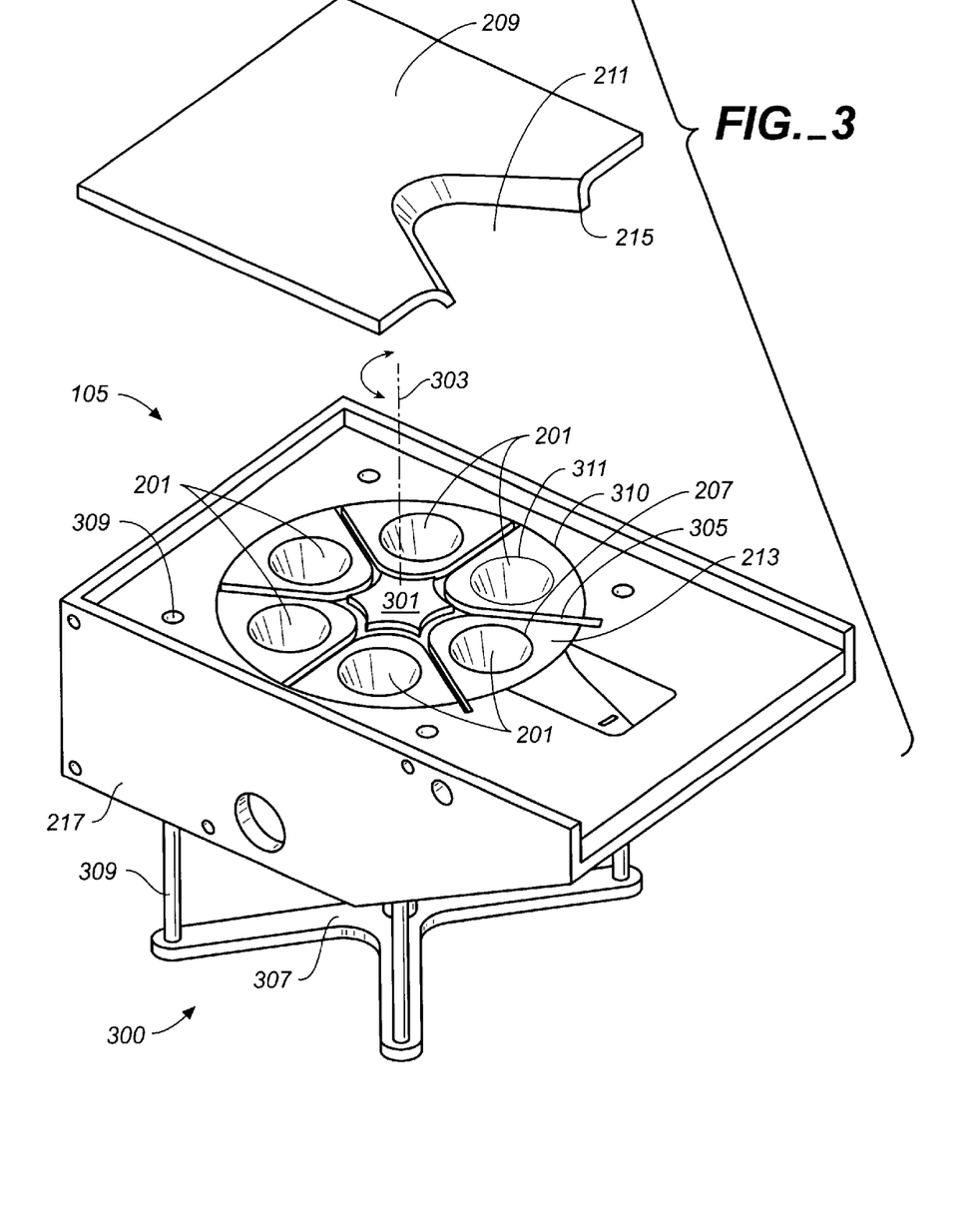
FIG. 3 is an exploded perspective view of a first embodiment of the invention.

The intersection of pockets 201 on the crucible surface 213 defines pocket edges 311 around each pocket. Turret 301 may have more or fewer pockets, the choice of six pockets being for illustrative purposes only. The crucible is mounted to the source such that it can rotate about the crucible axis of rotation 303. An electron beam source (not shown) located inside the source has an exit 203, from which an electron beam 205 emanates. The beam is directed from the exit to the material heating location 207 by magnets, also located inside the source (also not shown). The deflection of electron beams for evaporative heating, as well as sweeping the beam for controllable heating is well known in the art. Using such a deflection system, the heating location 207 comprises a finite area that is generally within the heated pocket edge. A crucible lid or cover 209 is positioned over the pockets has a cover opening 211 formed by protrusion or lip 215. Rotation of turret 301 allows for any one of the pockets to be open at a time. The uncovered pocket is aligned with heating location 207 and is thus termed the "heated pocket," while all of the other pockets are termed "unheated pockets." Location 207 is fixed relative to electron beam 205, while the each of crucible pockets 201 can be positioned near location 207 for sweepable heating of the exposed material. The area occupied by heating location 207 need not be larger than any one of pocket edges 311 to provide control of heating of the material in the pocket.

Details of the present invention are shown in the exploded perspective view of FIG. 3, in which the cover is removed from the source. Each of crucible pockets 201 has a trough, recess or groove 305 located on crucible surface 213 that is located between each pocket and all of the other pockets. The groove surrounding each pocket may either be isolated (not connected) to the other grooves, may be interconnected with the others, as in FIG. 3, and may by contained on surface 213 or extend beyond the edge of the surface. The three-dimensional shape of groove 305 matches that of lip 215 in the vicinity of the heated pocket, in matching pairs, that produces an interlocking, noncontacting baffle. Lip 215 and groove 305 thus situated cooperate to form a baffle, thereby blocking the line-of-sight between the heated and all of the unheated pockets.

Figure 4A:
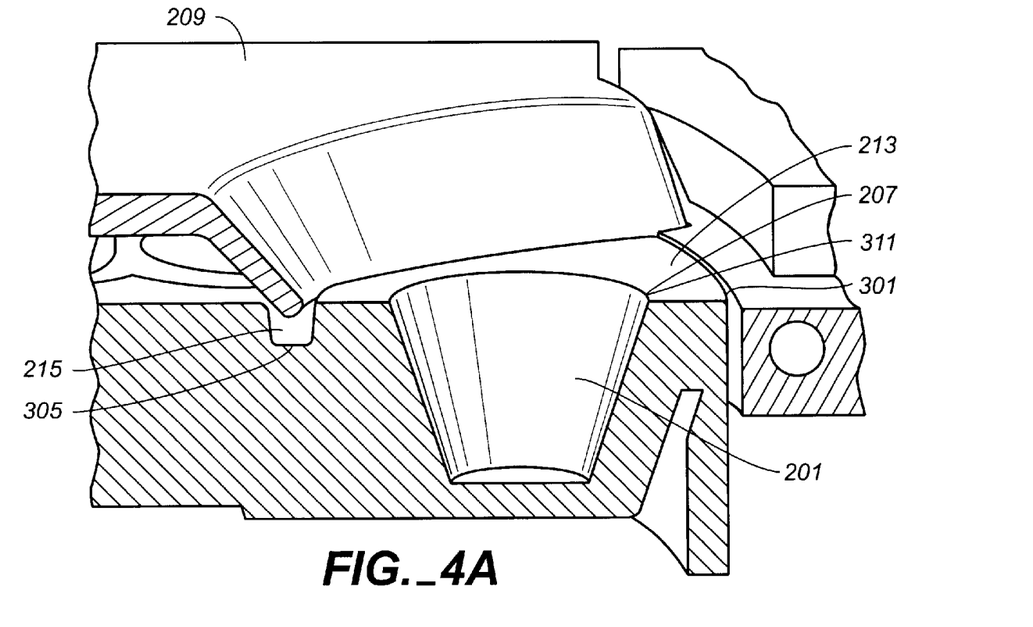
FIG. 4a is a perspective view of the heated pocket of a first embodiment of the invention with the cover in the "down" position.
Figure 4B:
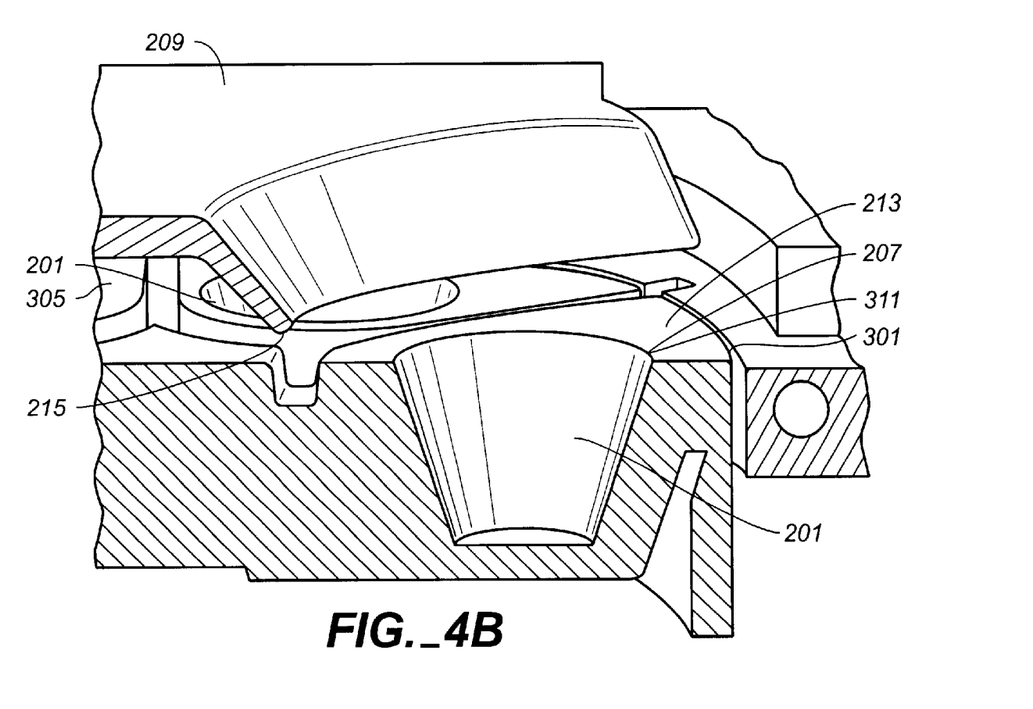
FIG. 4b is a perspective view of the heated pocket of a first embodiment of the invention with the cover in the "up" position.

Greater detail near the heated pocket of one embodiment is shown in FIG. 4. Pocket edge 311 shown in FIG. 4 contains the heating position 207, and thus pocket 201 shown in FIG. 4 is the heated pocket. FIG. 4a shows the source configured for coating, with cover 209 in the "down" position. In the down position, lip 215 extends into groove 305 without making contact. The baffle thus formed extends around pocket 201 far enough to provide a baffle between the heated and unheated pockets. FIG. 4b shows the cover "up" position, in which lip 215 is retracted from groove 305, permitting rotation of turreted crucible 301. To reduce the need to service the cover by removing deposit material, a vertical clearance between lip 215 and the adjacent groove 305 should exceed approximately 0.005"for line-of-sight blocking, and may have a horizontal clearance between the lip edge closest to the heated pocket of as large as 0.050"to accommodate deposits.

In this invention, the cover and crucible baffle arrangement blocks contaminants from propagating from heated to unheated pockets by eliminating the line-of-sight movement of coating vapors. Due to the low pressure, vapors travel nearly unimpeded until they strike one of the surfaces within system 101. Upon impact, a substantial amount of incident vapor molecules will stick to the surface, resulting in an accumulating deposit. By allowing sufficient clearance between baffle surfaces, deposits can accumulate over some period of time without presenting a source for cross-contamination. Thus the clearance between cover and crucible allows for deposits to accumulate on those surfaces without decreasing the ability of the baffle to block contaminants, since deposits further limit the line-of-sight, or to allow deposits to easily flake or rub off and contaminate other pockets. If materials do become dislodged from the cover, they would fall into a groove instead of a pocket, containing the contamination. Also, some materials of interest, such as gold, weld when surfaces having deposits of those materials are brought into contact. Thus surfaces having deposits of materials that contact weld can, under the conditions present in a high vacuum chamber, weld when brought into contact. Welding results in either binding mechanisms within the system, or dislodging relatively large flakes of deposit if movement occurs. Welding is prevented in the present invention by preventing contact of surfaces and by providing regions for deposits that are away from possible contact points.

The arrangement of the cover in this invention stands in contrast to prior art covers that relied on small clearances to reduce contamination, either by limiting (but not eliminating) line-of-sight contamination or by sealing the cover and crucible. It is important that the cover and crucible meet without contact, yet cooperate to form a baffle between heated and unheated pockets, and be movable between multiple pockets. It is also desirable to allow space for deposits in such a way that the deposits will not interfere with the noncontact line-of-sight baffle. There are many configurations of cover and crucible that will form the type of baffle to which this invention is directed, including, but not limited to, other cover lip and crucible groove shapes, a flat cover and a crucible with an edge that extends above the crucible, a cover with a groove and a crucible with a ridge, and combinations that result in more complex sinuous baffles. Additional contours or flat surfaces may also be included to separate deposits from crucible pockets. Other variations of cross-contamination prevention configurations within the scope of the invention include pockets having non-circular openings, such as regular or irregularly shaped two-dimensional shapes, multiple pockets of varying sizes, including shapes and/or volumes, pockets arranged linearly or in multiple rows on the crucible surface, or arranged in a close packed configuration to increase the amount of usable crucible space on the crucible surface, or in multiple circular patterns.

Operation of the Invention

When selecting between the multiple pockets, the relative motion between turret and cover should proceed in a manner that does not allow for the crucible and cover to contact. From the described cooperation of the cover and crucible to form a baffle of the present invention, it would be obvious to one skilled in the art that crucible selection motion and cover motion must be controlled to provided the stated advantages. Thus contact between the baffle component, or between and any parts which have accumulated deposits should be minimized during pocket selection. Many mechanisms and control systems could be configured to achieve those advantages, and the descriptions and embodiments provided here are illustrative and are not meant to limit the scope of the present invention.

Figure 5:
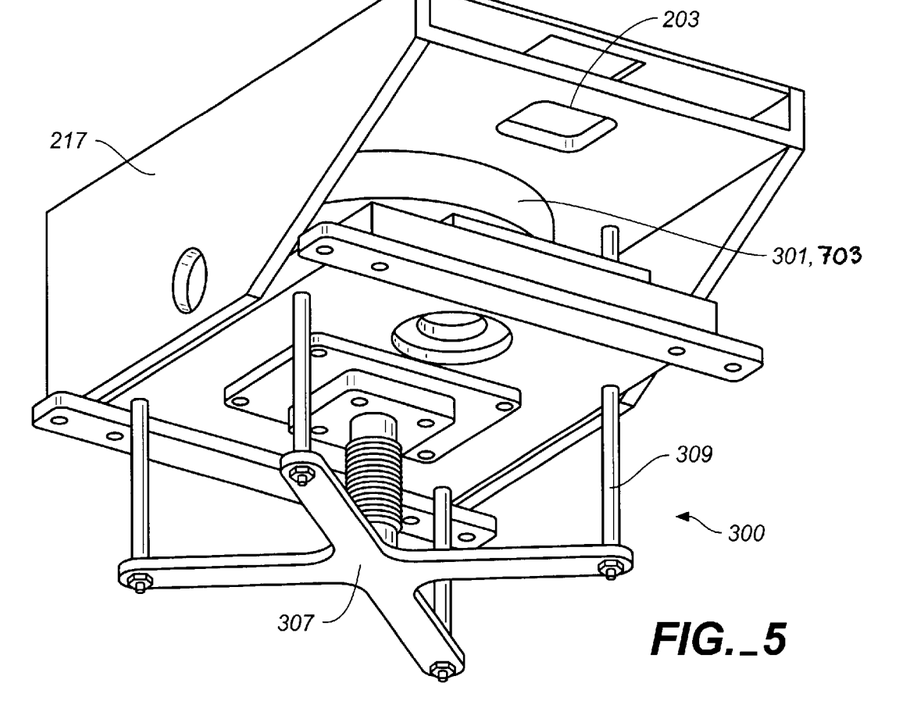
FIG. 5 is a perspective view from the bottom of a first and second embodiment of the invention.

For the rotatable pocket configuration of the first embodiment, the cover and crucible form two halves of a baffle that would impede rotation of the turret 301. The first embodiment thus includes a rotation mechanism (not shown) for rotating turret 301 to select from among multiple pockets 201, and a lifting mechanism 300 to allow rotation without contact of cover 209 and turret 301. The rotation mechanisms couples turret 301 to source housing 217, and can be controlled by external devices not shown to rotate turret 301 about axis of rotation 303. By controlling the rotational position of turret 301, any of pockets 201 can be brought into heating location 207. The rotation mechanism can consist of AC or DC motors or rotary or linear pneumatic actuators, and may also include sensors mounted on turret and housing to detect rotational position. FIG. 5 shows a bottom perspective view shows the lifting mechanism 300, including an actuator 307 and rods 309 that provide lifting motion to the cover 209 (not shown). Also shown is turreted crucible 301 and electron beam source exit 203. In one embodiment actuator 307 is a single action pneumatic actuator with a spring return enclosed in a bellows, with the spring forcing the cover into a normally up position. In another embodiment, actuator 307 is double acting, providing both raising and lower operations. Other lifting mechanism that could be used with this invention include, but are not limited to, lead screws, piezo-electric actuators, bimetallic elements, magnetic solenoid, and linear motors.

Figure 6:
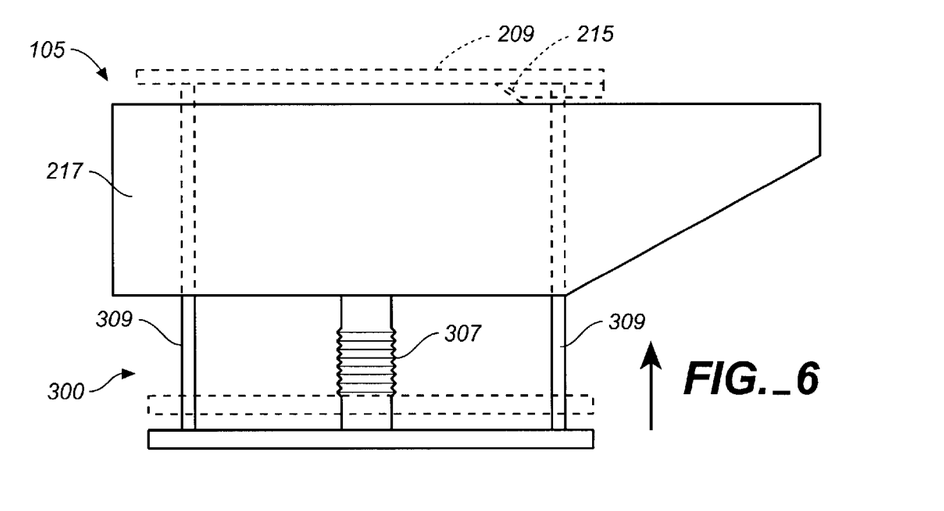
FIG. 6 is a side view of a first embodiment of the invention with showing cover motion.

The motion involved in lifting the cover is shown more clearly in the side view of FIG. 6. The solid and dashed cover lifting components (actuator 307, rods 309 and cover 209) shows the extreme points of motion. Cover is connected at its corners through rods 309 to actuator 307. In the normally up, dashed position, lip 215 clears the obstructing crucible, and in the forced down, solid position, the cover 209 is fully engaged. The combination of a rotational and lifting mechanism is generally useful for rotational turrets as illustrated in the first embodiment, providing a way of covering and uncovering multiple pockets without allowing contact of surfaces which may have deposits, especially near pockets which may become contaminated.

Additional Embodiments

Figure 7:
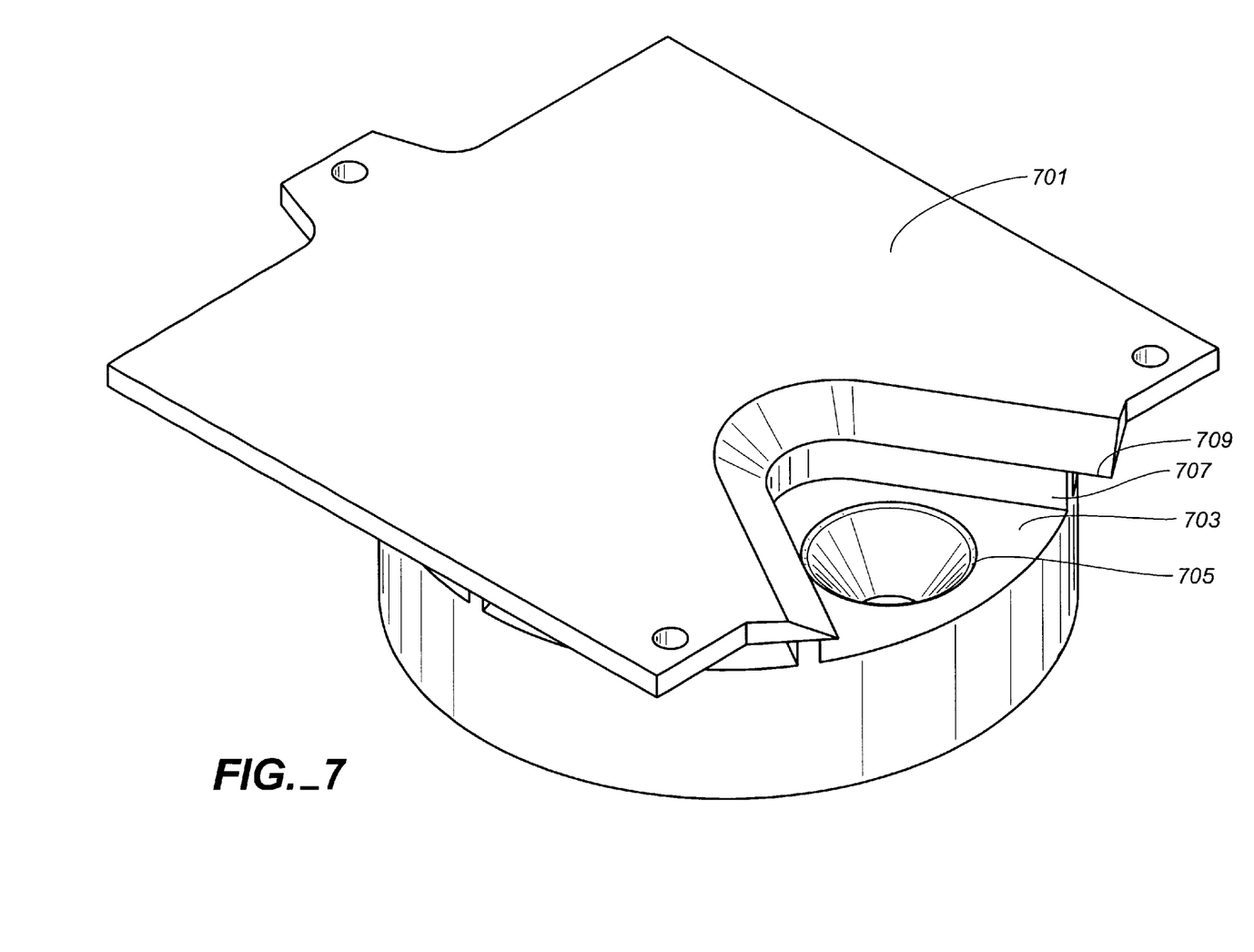
FIG. 7 is a perspective view of a second embodiment of the invention.
Figure 8:
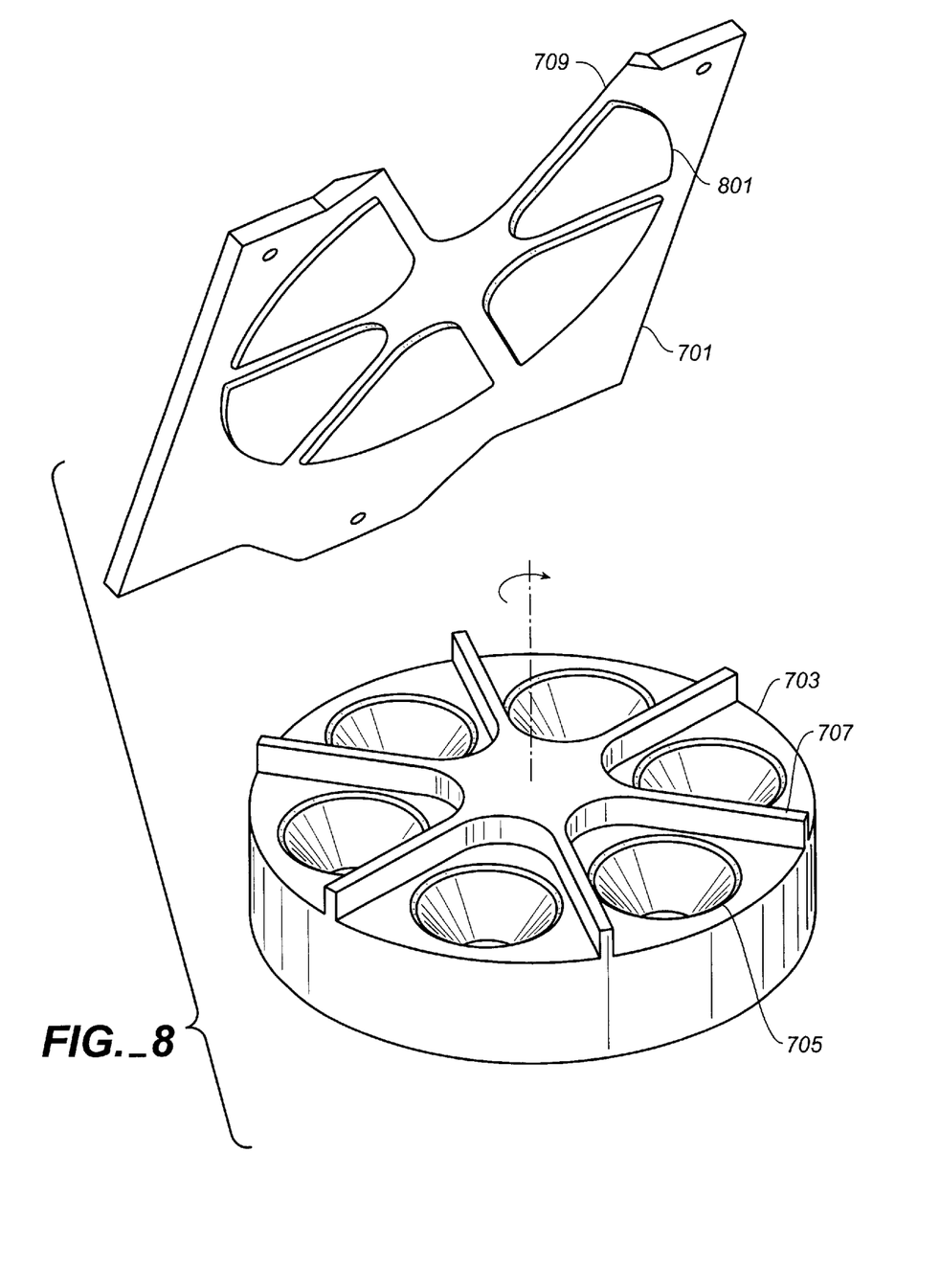
FIG. 8 is an exploded perspective view of a second embodiment of the invention.
Figure 9:
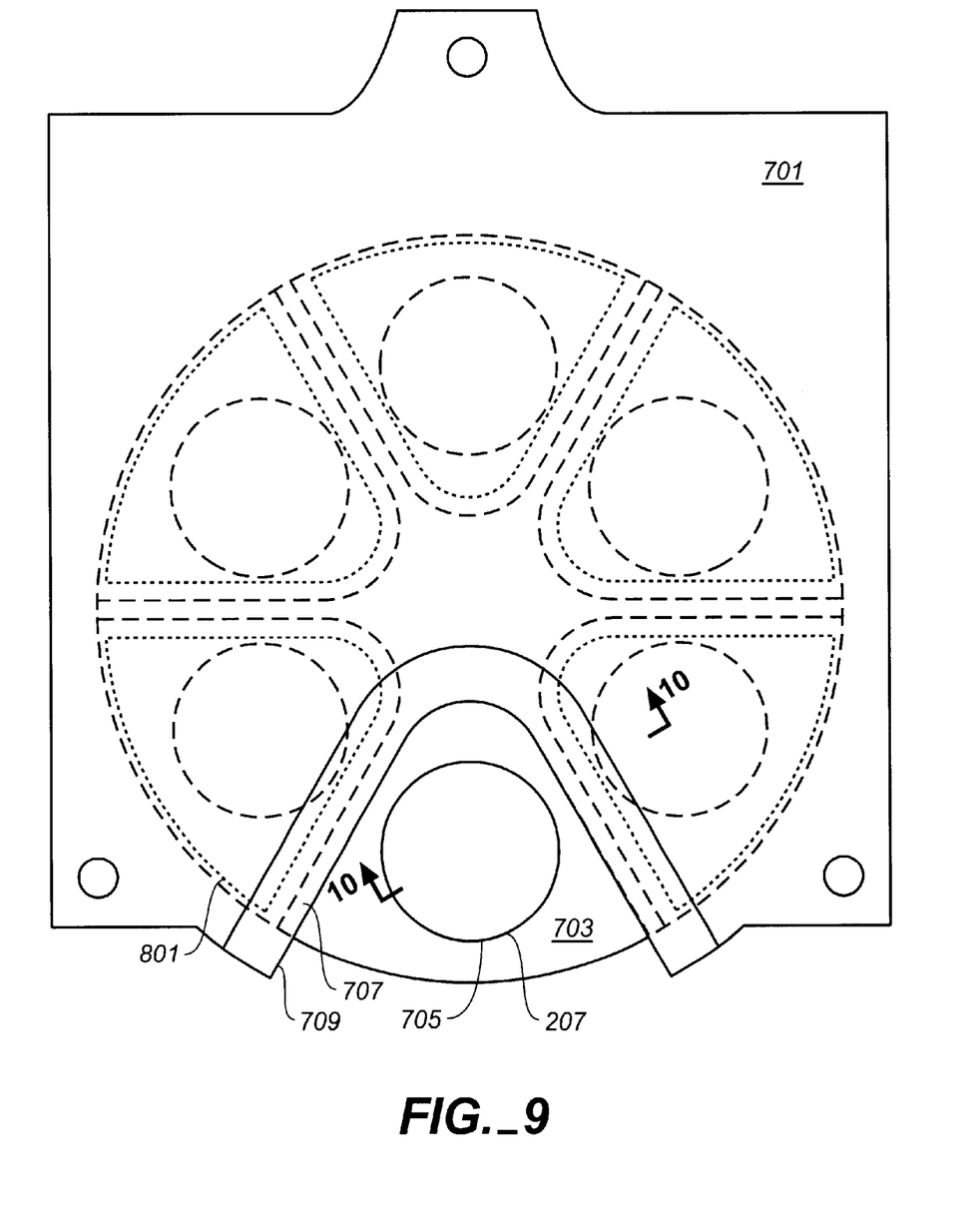
FIG. 9 is a top view of a second embodiment of the invention.
Figure 10A:
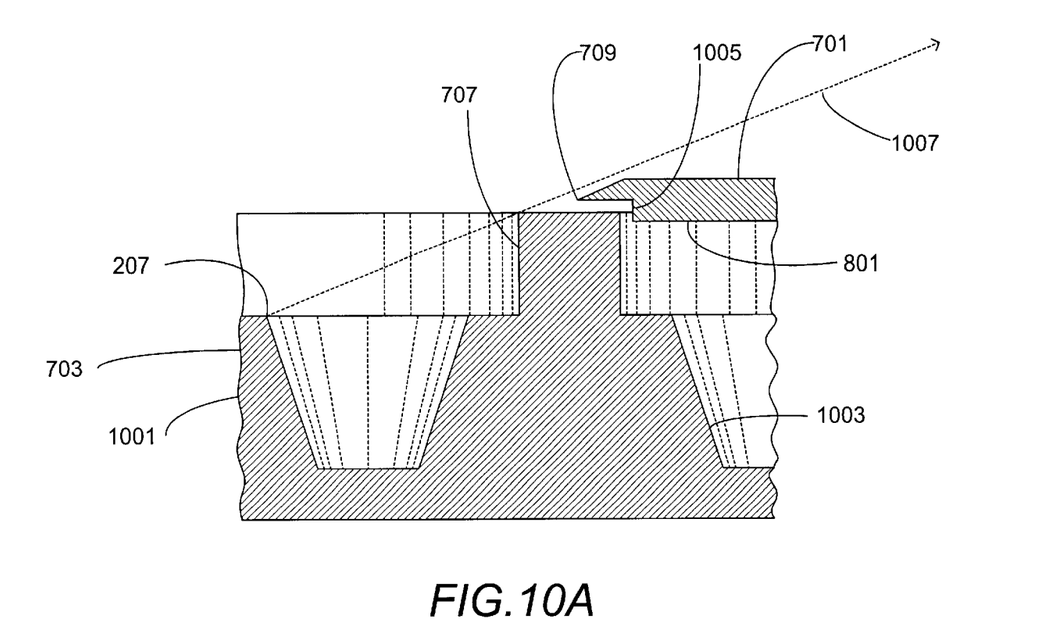
FIG. 10a is cross-sectional view of FIG. 9 showing the heated pocket and an adjacent unheated pocket of a second embodiment of the invention with the cover in the "down" position.
Figure 10B:
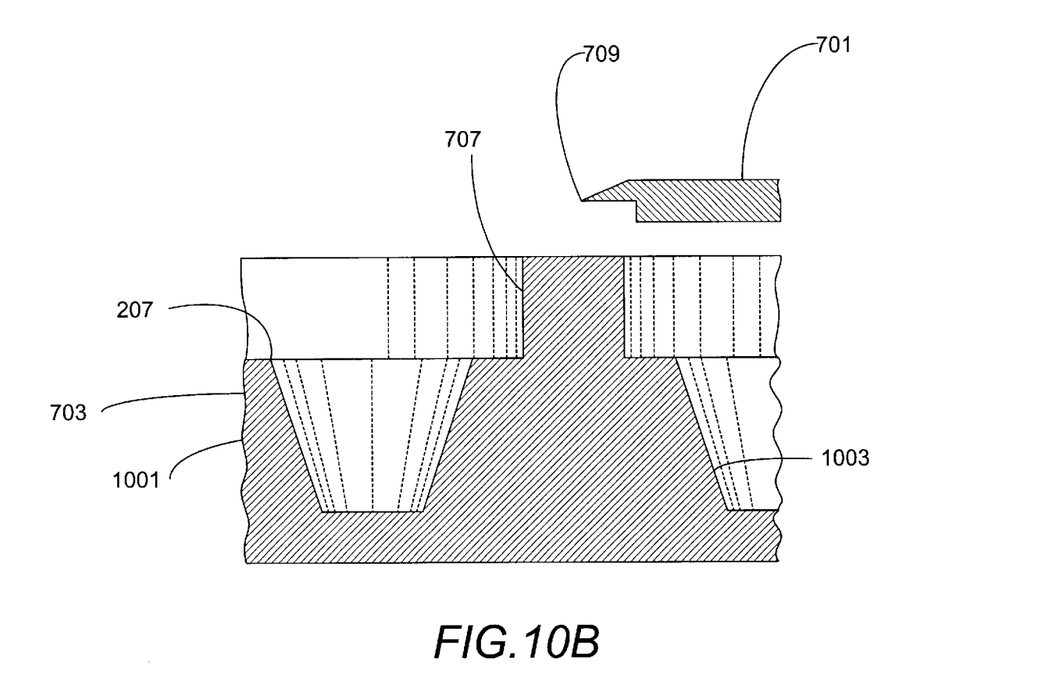
FIG. 10b is cross-sectional view of FIG. 9 showing the heated pocket and an adjacent unheated pocket of a second embodiment of the invention with the cover in the "up" position.

Details of a second embodiment of the present invention are shown in FIGS. 5 and 7 to 10, in which FIG. 5 shows a bottom view of the cover lifting mechanism, FIG. 7 is a perspective view, FIG. 8 is an exploded perspective view, FIG. 9 is a top view, and cross-sectional views of the cover are shown in an up configuration (FIG. 10a) and down configuration (FIG. 10b). A crucible cover 701 with a lip 709 is positioned over turreted crucible 703 which includes multiple pockets 705 and is rotatably mounted in a housing using techniques well known to those in the art for mounting and controlling crucible rotation, as discussed in the first embodiment. Cover 701 is liftably mounted to the housing, using mechanism 300 as shown in FIG. 5. as previously discussed. The main differences between the first and second embodiments is the manner in which a line-of-sight baffle is accomplished. Crucible 703 has a plurality of pockets 705, each of which has a barrier 707 extending away from crucible 703. Lip 709 is adapted to have approximately the same contour as barrier 707, as is best seen in FIG. 9. When cover 701 is aligned with crucible 703 as in FIGS. 7 or 9, one of pockets 705 is uncovered, with lip 709 near barrier 707 closest to the uncovered pocket. As with the first embodiment, the edge of uncovered pocket corresponds to the heating location 207, and thus the uncovered pocket is the heated pocket. Extending away from cover 701 towards crucible 703 are protrusions 801 that fit into the space between barriers 707. As with the first embodiment, cover 701 has an external lifting and rotation mechanism (not shown) that moves cover 701 away from crucible 703, can rotate any of the pockets 705 within lip 709 such that protrusions 801 fit within barriers 707, and then lowers the cover onto the crucible, coming close to but not touching the ends of the barriers. By lowering cover protrusions 801 below the tops of barrier 707, the line-of-sight between the uncovered and all of the covered pockets is blocked.

Further details and the operation of the second embodiment is illustrated in FIGS. 10a and b, which are sectional views of FIG. 9 taken through heated pocket 1001 and an unheated pocket 1003. Cover 701 includes protrusion 801 that forms a ledge 1005 near lip 709. In the view of the "down" position of FIG. 10a, the cooperation of barrier 707 and cover 701 form a baffle near ledge 1005. Ray 1007 is illustrative of a glancing trajectory of vapors that might leave heated pocket 1001 and deposit on cover 701. In the down position, cover 701 is situated below ray 1007, thus reducing line-of-sight contamination of the cover. Contaminates migrating over barrier 707 from heated pocket 1001 towards unheated pocket 1003 will be accumulated on cover 701 at ledge 1005. This will restrict the flow of coating vapors towards unheated pockets and reduce cross-contamination. FIG. 10b shows cover 701 of the second embodiment in an "up" position, allowing for rotation of turret 711 without contact between barrier 707 and cover 701. Line-of-sight blocking with the second embodiment is controlled independently of the shape of crucible contours, since blocking is not due to mutually mated surfaces as with the first embodiment. The degree of blocking can be varied by changing the protrusion 801 size and shape as well as the closest approach of cover 701 with crucible 703. While there is a variation in dimensions that will provide for contamination control, preferred dimensions include barriers 707 that extends from approximately 0.1 inches to approximately 1 inch above crucible 703 towards cover 701, protrusions 801 that extend at least approximately 0.02 inches down from lip 709 to form ledge 1005, and a vertical clearance between barrier 707 and lip 709 of approximately 0.005 inches.

Although the embodiments illustrated include a mechanism to lift the cover off of the crucible, the necessity of lifting cover is not necessary in all embodiments. For example, an additional embodiments of the invention would have a fixed cover and a movable crucible, while other embodiments would be to have a cover that is hinged so that only part of the cover need be raised for turret motion, or the barrier may be designed such that a specific motion in a plane parallel to the crucible surface maneuvers the pockets into a selected position without a lifting motion.

Hence, although this invention has been described with respect to the embodiment discussed here, those embodiments are illustrative only. No limitation with respect to these embodiments is intended or should be inferred. It will be observed that numerous variations and modifications may be effected without departing from the true spirit and scope of the novel concept of the invention, and it is intended that the scope of the invention be defined by the claims appended hereto.

Conclusion

The invention has now been explained with regard to specific embodiments. Variations on these embodiments and other embodiments may be apparent to those of skill in the art. The invention therefore should not be limited except as provided in the attached claims. It is understood that the examples and embodiments described herein are for illustrative purposes only and that various modifications or changes in light thereof will be suggested to persons skilled in the art and are to be included within the spirit and purview of this application and scope of the appended claims. All patents cited herein are hereby incorporated by reference in their entirety for all purposes.

What is claimed:

1. A crucible cover for a multiple pocket vapor source wherein the vapor produced by an electron bean can be directed to uncovered crucible pockets, comprising;
   (a) a crucible having a crucible surface, the surface having a plurality of pockets for holding coating materials to be evaporative heated; and
   (b) a crucible cover with a covering surface facing the crucible, where the pockets are covered or uncovered, and where there is at least one uncovered pocket and at least one covered pocket, such that the crucible surface and cover surface have cooperating surface features forming an interlocking, non-contacting, line-of-sight blocking baffle between the uncovered pockets and the covered pockets, whereby line-of-sight material contamination from heated vapors is reduced and that deposition on the cover and crucible does not result in cross-contamination between pockets
   (c) an actuator that lifts the crucible cover.

2. The cover of claim 1 wherein the clearance between the crucible surface and cover surface adjacent to a heated pocket is greater than about 0.005 inches.

3. The cover of claim 1 wherein at least a portion of the cover can move relative to the crucible, such that the cover can be moved between a down position for pocket covering and an up position to facilitate crucible rotation without contact between the cover and crucible.

4. The cover of claim 3 wherein the cooperating surface features comprise a crucible barrier extending from the perimeter of the crucible pockets towards the covering surface and a matching protrusion on the covering surface towards said crucible pocket and adjacent to said crucible barrier.

5. The cover of claim 4 wherein the crucible barrier is from 0.1 to 1 inches.

6. The cover of claim 4 wherein the protrusion is at least 0.02 inches.

7. The crucible cover of claim 1, wherein the actuator comprises a pneumatic or hydraulic mechanism.

8. The crucible cover of claim 1, wherein the actuator comprises a magnetic mechanism.

9. The crucible cover of claim 1, wherein the actuator comprises an electric motor.

10. A covered, multiple pocket vapor source assembly wherein the vapor produced by an electron beam can be directed to uncovered crucible pockets, comprising:
    (a) a housing;
    (b) a turreted crucible rotatably mounted within the housing, the crucible having a surface;
    (c) a plurality of pockets in the crucible, the pockets adapted for containing coating materials, and the turreted crucible rotatable to bring any of the material pockets into a position to receive energy from the electron beam;
    (d) a cover with a covering surface facing the crucible surface, the cover mounted to the housing, and the cover extending over all pockets not receiving energy; and
    (e) matching pairs of cooperating surface features on the cover surface and crucible surface, such that the cooperating surface features form an interlocking, non-contacting line-of-sight blocking baffle between the uncovered pockets and the covered pockets
    (f) an actuator that lifts the crucible cover.

11. The assembly of claim 10 wherein the cooperating surface features includes a protrusion on the cover surface towards the crucible surface.

12. The assembly of claim 10 wherein the clearance between the cooperating surface features adjacent to a heated pocket is greater than about 0.005 inches.

13. The assembly of claim 12 wherein at least a portion of the cover is liftably connected to the housing, such that the cover can be moved between a down position for pocket covering and an up position to facilitate crucible rotation without contact between the cover and crucible.

14. The assembly of claim 13 wherein the cover is liftably connected to the housing with a pneumatic actuator.

15. The assembly of claim 14 wherein the cover is liftable connected to the housing by a mechanism comprising:
    a) a pneumatic actuator located on the side of the housing opposite the crucible surface; and
    b) a set of connecting rods that connects the actuator to the cover.

16. A covered, multiple pocket vapor source assembly wherein the vapor produced by an electron beam can be directed to uncovered crucible pockets, comprising:
    (a) a housing;
    (b) a turreted crucible rotatably mounted within the housing, the crucible having a surface;
    (c) a plurality of pockets in the crucible, the pockets adapted for containing coating materials, and the turreted crucible rotatable to bring any of the material pockets into a position to receive energy from the electron beam;
    (d) a cover with a covering surface facing the crucible surface, at least a portion of the cover liftably mounted to the housing, and the cover extending over all pockets not receiving energy, where the cover can be moved between a down position for pocket covering and an up position to facilitate crucible rotation without interference between the cover and crucible and where the cover is liftably connected to the housing by a mechanism comprising
- (i) a pneumatic actuator located on the side of the housing opposite the crucible surface, and
- (ii) a set of connecting rods that connects the actuator to the cover; and (e) matching pairs of cooperating surface features on the cover surface and crucible surface, including a protrusion on the cover surface towards the crucible surface, such that the cooperating surface features form an interlocking, non-contacting line-of-sight blocking baffle the between the uncovered pockets and the covered pockets.

17. An electron beam vapor deposition assembly comprising:

a base member including circular array of x chambers wherein each chamber is separated from the adjacent chambers by a groove;

a cover member that covers x–1 chambers to expose one chamber, the exposed chamber containing a material to be vaporized by the electron beam; the cover member having a flange between each of the x chambers on a bottom surface of the cover member extending into but not contacting the groove such that the exposed chamber is separated from the adjacent chambers without the flange contacting the groove and without the cover member contacting the base member.

18. The assembly of claim 17 comprising:

a first mechanism that rotates the base member to expose each of the x chambers;

a second mechanism that lowers the cover member into the groove of the exposed chamber, and raises the cover member out of the groove of the exposed chamber.

19. The assembly of claim 17 wherein a clearance between the groove of the base member and the flange of the cover member is greater than about 0.005 inches.

20. The assembly of claim 17 wherein the flange protrudes at least 0.02 inches from the bottom surface.

21. An electron beam vapor deposition assembly comprising:

a base member including circular array of x chambers wherein each chamber is separated from the adjacent chambers by a flange;

a cover member having a bottom surface that covers x–1 chambers to expose one chamber, the exposed chamber containing a material to be vaporized by the electron beam; the cover member having raised portions that extend from the bottom surface of the cover member extending into the x–1 chambers without the flange contacting the groove and without the cover member contacting the base member.

* * * * *